United States Patent [19]

Tholen et al.

[11] 3,953,873

[45] Apr. 27, 1976

[54] AUTOMATIC CAMERA FOR DUAL PRINTING PLATES

[75] Inventors: John H. Tholen, St. Paul; John C. Winters, Birchwood Village, both of Minn.

[73] Assignee: Minnesota Mining & Manufacturing Company, St. Paul, Minn.

[22] Filed: Nov. 13, 1974

[21] Appl. No.: 523,420

[52] U.S. Cl. ............................. 354/315; 354/316; 354/319; 354/78; 355/27; 355/28; 355/46; 355/73
[51] Int. Cl.² ...................................... G03D 17/00
[58] Field of Search ........... 354/315, 316, 319, 297, 354/78, 82, 354; 355/27, 28, 46, 3 R, 133, 73, 18

[56] References Cited
UNITED STATES PATENTS

| | | | |
|---|---|---|---|
| 3,523,726 | 8/1970 | Herman | 355/27 X |
| 3,718,395 | 2/1973 | Hollwedel | 355/27 |
| 3,843,253 | 10/1974 | Mikan et al. | 355/28 X |

*Primary Examiner*—Robert P. Greiner
*Attorney, Agent, or Firm*—Alexander, Sell, Steldt & DeLaHunt

[57] ABSTRACT

A camera adapted for making a chemically developed printing plate or a more economical dry developed printing plate. The camera has a magazine for supplying selectively one of two types of light sensitive film material, advancing a severed sheet of the selected material to the image plane, and directing that subsequently imaged plate to the associated processing station to produce a developed and ready printing press plate.

8 Claims, 5 Drawing Figures

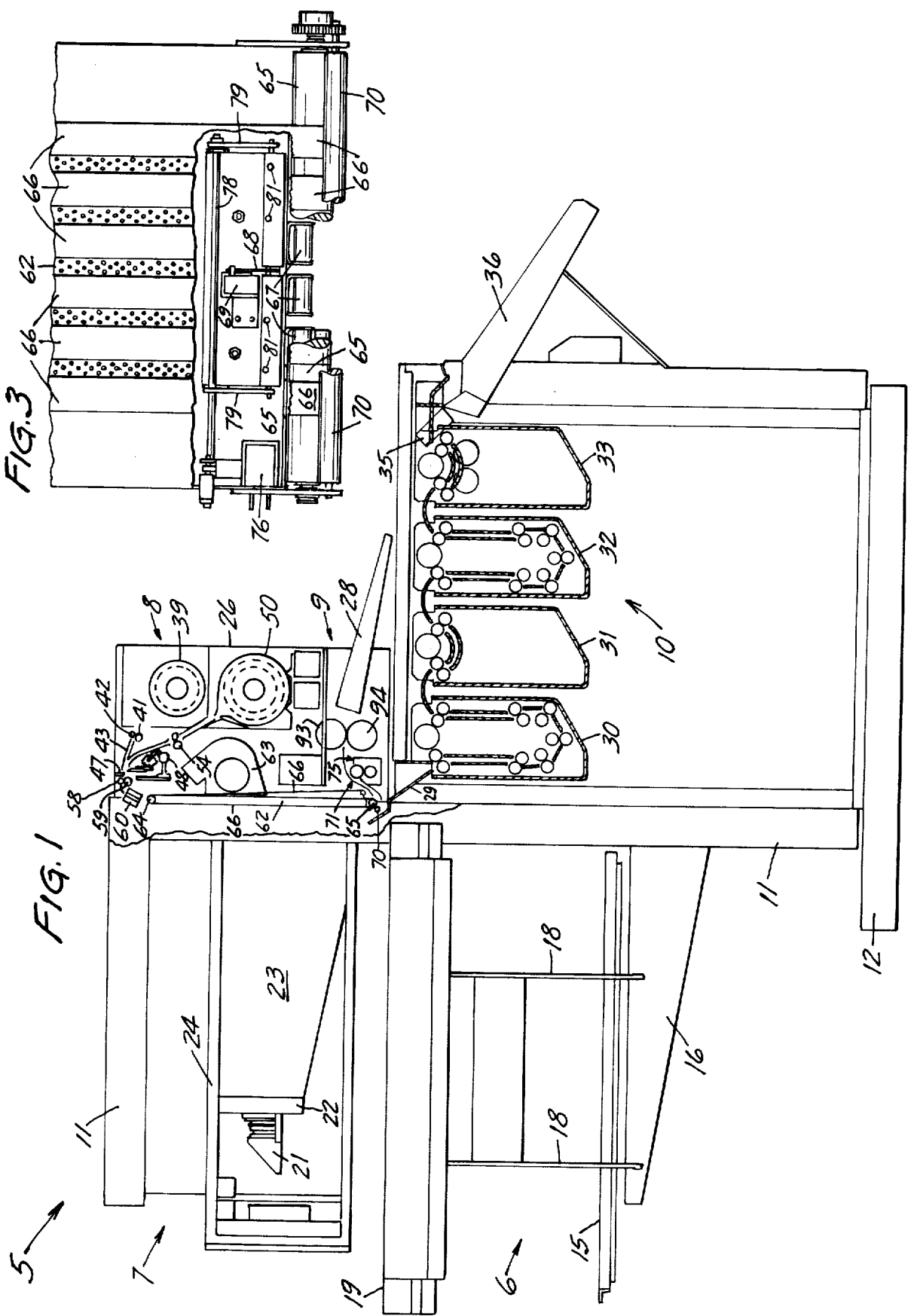

AUTOMATIC CAMERA FOR DUAL PRINTING PLATES

BACKGROUND OF THE INVENTION

1. Field of the Invention

This invention relates to an improved automatic printing plate maker such that the camera is adapted selectively to produce a printing plate of two different qualities in terms of the press life of the plate. In one aspect this invention relates to an improved magazine for a plate maker which affords the selectivity of making a plate from one of two different imagable developable printing plate making materials.

2. Description of the Prior Art

Automatic press plate cameras for making a printing plate generally comprise means for holding a web or roll of photographically sensitized sheet material, advancing means for advancing the sheet material to a focal plane, optical components for focusing an image from a copy board on the sheet material, means for exposing the sheet material and removing the exposed sheet material from the focal plane, and means for developing and processing the exposed material to produce the printing plate or press plate. Such machines have been described in the patent literature and sold commercially. One such patent is U.S. Pat. No. 3,045,540, issued July 24, 1962, to Arthur W. Caps et al. These machines have basically been provided to take a specific type of light-sensitive material, expose the same and automatically process the same to produce the press plate. Machines of this sort have been utilized for photographic processing of the light-sensitive sheet material, either by chemical development as in the Caps et al patent or by electrostatic development as is accomplished in machines as disclosed in the following U.S. Pat. Nos. 3,684,366, issued Aug. 15, 1972 to H. C. Hollwedel Jr.; or 3,634,006, issued Jan. 11, 1972 to H. C. Hollwedel Jr., wherein the original image is on microfilm and projected therefrom to the plate material.

The known prior art however does not teach the building of a system which can utilize a common image input, a common exposure plane, and has separate processors and diverter means for directing sheets thereto, to produce two grades of press plates alternatively, as desired by the operator.

SUMMARY OF THE PRESENT INVENTION

The present invention provides a printing plate camera having the capability of alternatively producing different grades of printing plates. By grade of the printing plate the features considered are cost and the press life of the plate. The plate camera comprises a supporting frame, an imaging means, e.g. a copy board for supporting the original to be imaged onto the press plate, means for lighting the copy board and a camera. The cameral further comprises a magazine for supporting a sheet or web of light-sensitive chemically processed plate material for making plates of a high quality and extended press life and for supporting a sheet or web of dry developed photoconductive plate material for making a printing plate, means for feeding a length of a material from said holding means past a common cutting means, transport means for supporting the cut sheet of material at the exposure or image plane, means for selectively diverting the cut sheet to a processor for the chemical development of the sheet material, or a processor for the dry development of the web material. The processor for the chemical development of the exposed web material comprises a series of processing tanks for developing and processing the chemically developed plate material. The processor for the dry development comprises a toner powder applicating station, and a fusing station. Operation of the camera for the dry development includes the charging of the face of the photoconductive material as the same is advanced onto a transport for holding the same at the exposure or image plane.

This magazine for the supply of the two types of plate material is hingedly mounted on the back of the camera section such that the back of the camera may be opened to service that area of the machine. This magazine will also support at the lower end of the transport means for the cut sheet, the processor for the dry development of the plate material. The transport means includes a diverter for directing the different sheets to the appropriate processor.

DESCRIPTION OF THE DRAWING

The present invention will be more fully understood after referring to the following detailed description of the preferred embodument wherein:

FIG. 1 is a schematic elevational view of the machine with portions removed to show interior construction;

FIG. 3 is a fragmentary transverse sectional view of the image plane and sheet transport;

DETAILED DESCRIPTION OF THE PREFERRED EMBODIMENT

Figure 4:
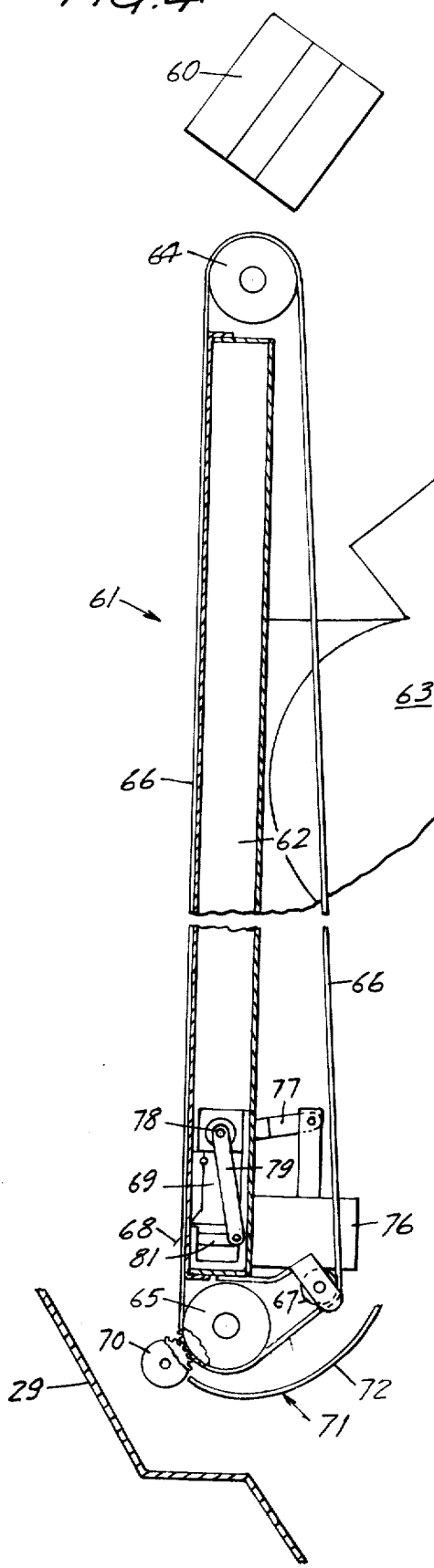
FIG. 4 is a detailed longitudinal sectional view of the transport and exposure plane for the web material taken approximately along line 4—4 of FIG. 3.

The camera and processor for printing plates according to the present invention is generally designated 5 and comprises an imaging means or a copy supporting and lighting section 6, an image projecting or camera section 7, a magazine section 8, a dry developing section 9, and a chemical developing section 10. The various sections of the plate maker 5 are supported from a main frame 11, carried on a base 12.

The copy supporting and lighting section 6 comprises a copy board 15 supported in a horizontal plane by a pair of parallel forwardly extending arms 16. The arms 16 are vertically adjustably supported in the frame 11 for vertical movement to control the position of the copy board 15. Mounted by support brackets 18 from the arms 16 are lamp housings 19 which support quartz lamps for uniformly illuminating the entire surface of the copy board 15. Thus the object to be photographed and printed is placed on the copy board 15 and the vertical movement of the copy board permits the preferred magnification of the image onto the image plane of the magazine 8. The imaging camera section 7 is supported from the frame 11 and the camera comprises a lens and prism assembly 21 mounted on a front plate 22 which is connected by a light-tight bellow 23 to the frame 11. The front plate 22 is supported in a track in a pair of horizontal frame members 24 which permit the lens and prism assembly 21 to move horizontally to position the assembly 21 in the desired position above the copy board 15. The lens and prism assembly 21 comprises a shutter for permitting the image from the copy board to be projected for the desired interval by the lens onto the image plane of the magazine section 8.

The magazine section 8 is supported from the frame 11 and is hinged along a vertical edge to the frame 11. The magazine section 8 in its normal position covers an enlarged opening in the frame 11 behind the bellows 23 in a light tight manner. The magazine 8 comprises a rectangular housing 26 which supports the plate materials and the developing section 9 which section 9 discharges the processed plates therefrom into a receiving tray 28.

The chemical developing section 10 comprises a first guide and deflecting chute 29 which directs an exposed sheet of plate material to be chemically processed into a first bath of developer solution contained in a tank 30. Within the tank 30 are a series of rollers and guide members which are suitably driven to direct and carry a sheet of the material through the bath of developer. The sheet is then moved from the developer tank 30 into a spray rinse tank 31. The spray rinse tank 31 has suitable means also for supporting the sheet and directing the same therefrom into a tank 32 of activator solution. In the tank 32 is positioned suitable rollers and guide plates to direct the sheet therethrough and over into a final scrub rinse tank 34. From the scrub and rinse tank 34 the sheet is directed through an infrared dryer 35 and is discharged into a receiving tray 36. The tanks 30–34 and dryer 35 are suitably supported in a light tight cabinet member and suitable plumbing is provided such that the solutions are maintained in the tanks at the desired level and the rollers are suitably driven by known means. In the tanks the primary drive roller at the top of each tank is coupled to the other rollers to drive the same at a predetermined speed to move the sheets therethrough and properly process the same.

Referring again to the magazine section 8, the magazine comprises the hinged housing 26 with a suitable support 38 for a supply roll 39 of light sensitive dry developable photoconductive plate material 40. The plate material 40 comprises a backing having a surface coating of photoconductive material, e.g., zinc oxide and is positioned between a drive roller 41 and a pressure roller 42 for driving the web material from the supply roll 39. The drive roll 41 is driven from a suitable motor through an electrically operated clutch to drive the roller 41 for a predetermined time interval. From the drive roll 41 and 42 the dispensed strip passes through the guide members in a chute 43 and past a cut-off device 45 in the form of a reciprocating knife 46 which extends across the path of the plate material. The knife 46 is operated in response to energization of an electrically operated clutch (not shown) which drives a shaft 48 to move a crank arm and drive the cutting knife 46 of the cut-off device 45 across the web path and the cooperating shear knife 47 to sever the plate material.

A second supply roll 50 of light-sensitive photographic plate material is supported by a support member 51 in the magazine section 8. The roll of light-sensitive material 50 is a chemically developable web material and it is drawn from the roll 50 by a drive roller 54 and pressure roller 55 into a pair of plates of the guide chute 43 to direct the strip material across the cutting knife 46.

Opposite the cut-off device 45 is a set of drive rollers 58 and 59 which direct the sheet material through a corona discharge device 60 which serves to apply when activated a uniform negative charge on the photoconductive surface of the plate material 40. As the plate material leaves the corona discharge device 60 it is directed into contact with a belt transport device 61 which includes a vacuum chamber 62 and a plurality of endless belts 66. The chamber 62 is partially evacuated by a fan 63. The chamber 62 has a generally planar foraminous front surface across which the belts 66 are directed in spaced relationship around a roller 64 positioned across the upper edge of the chamber 62, a roller 65 positioned across the lower end of the chamber 62, and individual tension rollers 67. The endless belts 66 move a cut sheet of plate material onto the exposure face of the chamber 62 and supports it in a flat image plane for exposure by the camera section 7.

Referring to FIGS. 3 and 4, the drive for the belt 66 is interrupted by the sheet material moving across the actuating lever 68 of a switch 69 positioned at the lower end of the chamber 62 and extending out of the front face thereof between two of the belts 66. The lower roller 65 for the belts 66 is provided with a gear which engages a gear on a second pressure roller 70 to direct the sheet material entering the nip between the rollers 65 and 70 into a second guide member 71 which includes a plate 72 and a spaced plate 73 having a smooth lower surface which supports and directs the sheet to and over a toner powder station 75 of the dry processor section 9. When a sheet is placed over the face of the chamber 62 at the image plane the belts carry it down until the switch 69 is operated which switch discontinues the belt drive by disengaging the electric clutch and initiates the exposure cycle.

Positioned adjacent the lower edge of the chamber 62 is a diverter operative to position the lower edge of the exposed sheet in a position to be directed toward the nip of rollers 65 and 70 or toward the guide plate 29 and into the chemical processor section 10. The diverter comprises a solenoid 76 supported on the rear side of the chamber 62 which oscillates a radial arm 77 connected to a shaft 78. Rotation of the shaft 78 under the movement of arm 77 will oscillate a pair of radial arms 79 which are pivotally connected to the opposite ends of a rod 80 which rod has a plurality of radially projecting pins 81 carried thereon which project from a recessed position on one side of said face through guide means to a position projecting from the face of chamber 62 between the belts 66. The pins 81 when in projected position will lift the lower edge of the sheet on the image plane off the belts and away from the chamber 62 to divert the sheet toward the chute 29. As the drive for the belts 66 is again energized the sheet will be carried over the pins 80 and into the chemical processor section 10. When the solenoid 76 is not actuated, after exposure of a plate with the plate camera in the mode for the dry plate material, the plate is directed to the nip between the roller 65 and 70 upon energization of the belt drive and the plate will be directed into the nip and toward the toner powder station 75.

Figure 5:
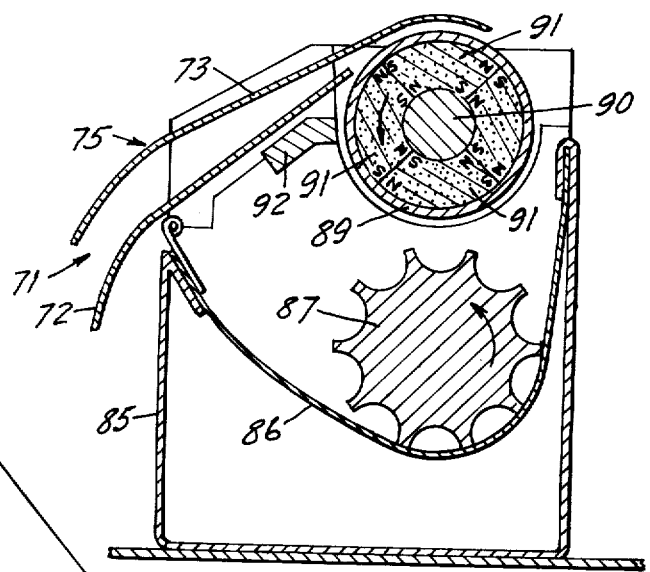
FIG. 5 is a detailed sectional view of the toner powder applicating station for the dry development of the photoconductive web material.
Figure 2:
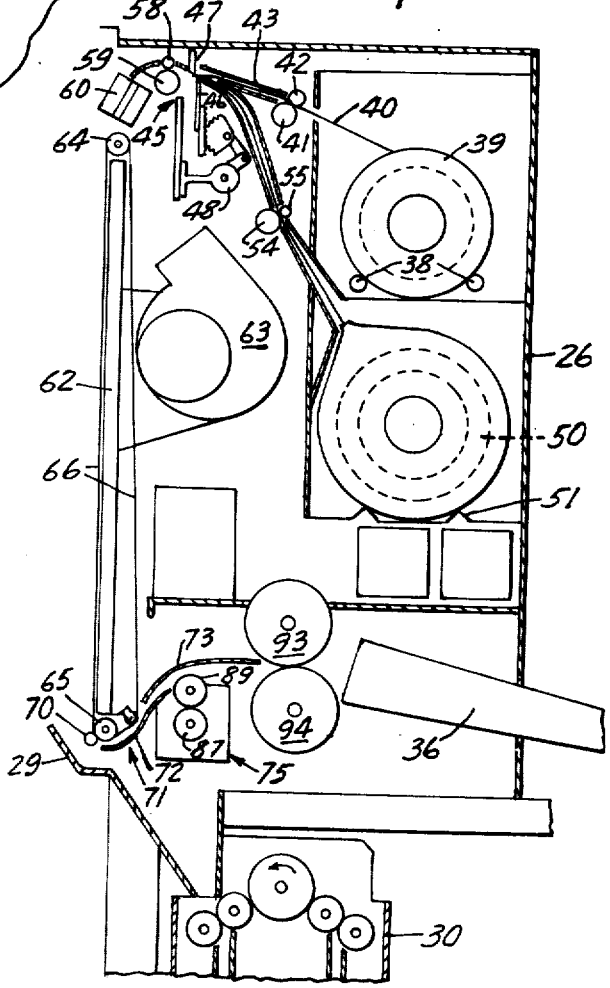
FIG. 2 is a fragmentary enlarged view of a portion of FIG. 1.

Referring now to FIG. 5 there is shown a cross-section of the toner powder developing station 75 comprising a frame 85 which is generally U-shaped and includes a flexible member 86 forming a trough or hopper for the conductive magnetically responsive toner powder particles. Positioned within the trough formed by the member is a nonmagnetic fluted roller 87 which is driven counterclockwise as shown to carry powder from the trough into contact with the outer peripheral surface of a stationary hollow conductive nonmagnetic cylindrical sleeve 89. The sleeve 89 is supported above and parallel to the axis of the roller 87 and coaxially about a rotatable magnetizable shaft 90 supporting a plurality of segment-shaped axially extending magnet members 91. The magnets 91 around the shaft 90 rotate counterclockwise with the shaft 90 and are magnetized to carry powder about the outer periphery of the sleeve 89 in the opposite direction upward past a coating knife 92 into contact with the photoconductive coating on the sheet of plate material. The shaft 90 and roller 87 are suitably journalled and driven by suitable belt drives. The sheet is then developed as it is guided across the magnetic roller between the sleeve 89 and the guide plate 73 and is then carried directly to a nip between two pressure fusing rollers 93 and 94. Fusing rollers 93 and 94 are steel rollers contacting to provide sufficient pressure on the particulate material such that the same is fused onto the face of the sheet of plate material. The developed sheet is then discharged into the tray 28.

The plate-making machine of the present invention is provided with a control circuit such that the operator selects a type of sheet material from which he proposes to make a press plate. The selection is based on whether a press run of about 500 impressions or about 2000 to 5000 is desired. Thus he selects a mode of operation on a control panel and energizes the appropriate circuit and mode of operation to start the feed rollers 41, 42, or the feed rollers 54 and 55 to feed the sheet material across the cutting device. Whichever set of feed rollers are energized the time of their operation is controlled to feed a predetermined length of the strip material from the roll 39 or 50. After the predetermined length of sheet material has been fed across the knife the feed stops and the cutting device 45 is cycled. Cycling of the cutting device 45 then energizes the feed rollers 56 and 57 to continue to carry the cut web onto the transport 61 which is operating to position the cut sheet at the focal plane. In the event the photoconductive plate material from the roll 39 was utilized the corona discharge device 60 would have operated to place a uniform negative charge on the photoconductive surface or face of the sheet material as it was positioned over the exposure plane. The transport 61 continues to drive the sheet until it engages the arm 68 of the switch 69. The drive is then discontinued. When the switch 69 is operated the exposure also begins and the lamps 19 illuminate the copy board 15 and time the operation of the shutter to expose the sheet material at the image plane. Upon completion of the exposure cycle the mode of operation will then actuate the solenoid 76 if the sheet material is to be chemically developed, if not, only the transport 61 will be energized, driving the exposed sheet material through the nip between the rollers 65 and 70 to be dry developed. If the solenoid 76 is operated the diverter pins 81 will lift the sheet material along the edge adjacent roller 65 and the sheet as it is moved off the face will be directed to the guide 29.

The plate material for the lower quality plate for making fewer copies may utilize a special paper which is coated with a zinc oxide on one side to enable the paper to accept and hold the electrical charge for a short period of time. There are however other types of photoconductors which may be utilized for the practice of the present invention. The dry processing is discussed in greater detail in U.S. application Ser. No. 430,044, filed Jan. 2, 1974 in the name of Arthur Kotz, and assigned to the assignee of this application. The sheet material for the chemical development for the making of a printing plate is disclosed in copending U.S. application Ser. No. 397,986, filed Sept. 21, 1964, titled Product and Method, of Tore Eikvar, which application is assigned to the assignee of this application.

In this application where the term "plate material" "sheet material" or "web material" is used it will refer to a roll of material having a light sensitive coating whether it be to photographically provide a latent image on the material or to change the conductivity of the coating on the material. It is also presumed that the material may be fed as sheets from stacks of material rather than from rolls onto the transport as disclosed herein without departing from the present invention. The plate camera could have the plate material imaged by projection of an image onto the focal plane from a microfilm original. A projection system could be incorporated to be mounted also on the frame 11 adjacent the camera, and mirrors can be pivoted into place within the bellows to so direct the image.

Having thus described a preferred embodiment of the present invention it will be understood that the invention protected is defined by the appended claims.

We claim:

1. A printing plate developing machine comprising support means for supporting a sheet of light sensitive plate material in exposing position, means for transporting the plate material to said support means and for moving said plate material off said support means, chemical developing means for developing a light-sensitive photographic plate material, electrographic developing means for developing a plate material having a photoconductive coating, a first guide means for receiving plate material moved off said support means, and directing said plane material to said chemical developing means, and a second guide means for receiving plate material moved off said support means and directing said plate material to said electrographic developing means, and diverting means for directing said plate material to one of said first guide means or said second guide means as the same is being moved off said support means.

2. A printing plate developing machine according to claim 1 wherein said support means comprises means defining a chamber having a generally planar face having perforations therein, means for partially evacuating said chamber, and wherein said means for moving said plate material comprises spaced endless belts disposed about said chamber and supported by parallel rollers disposed one along each of two opposite edges of said face, and drive means for one of said rollers.

3. A printing plate developing machine according to claim 2 wherein said diverting means comprises pin means for engaging the plate material on said support means at a position adjacent an edge thereof for pushing said plate material away from said edge as the same is moved toward said edge on said belts.

4. A printing plate developing machine according to claim 2 wherein said diverting means comprises a plurality of pins supported for movement through said planar face at spaced positions along one edge and between said belts, actuatable means for moving said pins from a position recessed on one side of said face to a position projecting from said face for locating said pins to direct said plate material as it is moved off said face toward said one edge into engagement with said first guide means.

5. A printing plate developing machine according to claim 1 wherein said means for transporting comprises
   first holding means for supporting a first supply of plate material,
   second holding means for supporting a second supply of a different plate material,
   drive means for drawing plate material from said first supply or from said second supply,
   cutting means for cutting a length of drawn plate material, and
   means for placing said material onto said support means in said exposing position to cover a substantial area thereof.

6. A printing plate developing machine according to claim 5 wherein corona charging means are positioned along the path of the plate material between said cutting means and said means for placing said material onto said support means.

7. A printing plate developing machine comprising support means for supporting a sheet of light-sensitive plate material in exposing position, means for transporting the plate material to said support means and for moving said plate material off said support means, a first guide means for receiving plate material moved off said support means and directing it to a chemical processor for chemically developing plate material and a second guide means for receiving plate material off said support means and directing the plate material to an electrographic processor for developing the plate material with a toner powder, diverting means for directing said plate material to one of said first guide means or said second guide means as the same is being moved off said support means, first holding means for supporting a first supply of plate material, second holding means for supporting a second supply of a different plate material, drive means for drawing plate material from said first supply or from said second supply, cutting means for cutting a length of drawn plate material, and means for placing said material onto said support means in said exposing position to cover a substantial area thereof.

8. A printing plate developing machine according to claim 7 wherein corona charging means are positioned along the path of the plate material between said cutting means and said means for placing said material onto said support means.

* * * * *